(12) United States Patent
Boulic

(10) Patent No.: US 6,603,963 B1
(45) Date of Patent: Aug. 5, 2003

(54) REMOTE LOOP-BACK DEVICE

(75) Inventor: Claude Boulic, Paray Vieille Poste (FR)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/445,946

(22) PCT Filed: Jun. 17, 1998

(86) PCT No.: PCT/EP98/04175

§ 371 (c)(1),
(2), (4) Date: Mar. 27, 2000

(87) PCT Pub. No.: WO98/59415

PCT Pub. Date: Dec. 30, 1998

(30) Foreign Application Priority Data

Jun. 20, 1997 (FR) .............................................. 97 07964

(51) Int. Cl.⁷ ................................................. H04B 1/26
(52) U.S. Cl. ..................... 455/313; 455/315; 455/323; 333/250; 333/280
(58) Field of Search ................................ 455/315, 313, 455/322, 323, 324; 333/250, 218; 340/505

(56) References Cited

U.S. PATENT DOCUMENTS

| | | | | |
|---|---|---|---|---|
| 4,251,817 A | * | 2/1981 | Kimura et al. ............... | 333/247 |
| 4,450,584 A | * | 5/1984 | Saka et al. ............. | 340/825.72 |
| 4,679,249 A | * | 7/1987 | Tanaka et al. ............. | 333/21 R |
| 4,691,379 A | * | 9/1987 | Shizume ..................... | 455/319 |
| 4,716,386 A | * | 12/1987 | Lait ........................... | 333/248 |
| 5,125,110 A | * | 6/1992 | Nusair ........................ | 455/327 |
| 5,511,238 A | * | 4/1996 | Bayraktaroglu ....... | 331/107 DP |

FOREIGN PATENT DOCUMENTS

| | | | | |
|---|---|---|---|---|
| EP | 0 073 511 A2 | 8/1982 | ............. | H01P/1/16 |
| EP | 0 154 496 A2 | 2/1985 | ............. | H01P/5/04 |
| EP | 0 190 902 A2 | 2/1986 | ............. | H03D/9/06 |
| EP | 0 249 310 A1 | 3/1987 | ............. | H01P/5/107 |

OTHER PUBLICATIONS

International Search Report dated Oct. 23, 1998.

* cited by examiner

Primary Examiner—Edward F. Urban
Assistant Examiner—Khawar Iqbal

(57) ABSTRACT

A remote loop-back device with elements outside a waveguide such that the elements do not interfere with propagation of waves traveling in the waveguide. The remote-loop-back device also uses lossless lines of defined length for transporting the microwave signals outside the waveguides.

3 Claims, 2 Drawing Sheets

REMOTE LOOP-BACK DEVICE

This application is a continuation of application Ser. No. PCT/98/04175, filed Jun. 17, 1998.

FIELD OF THE INVENTION

The present invention relates to a remote loop-back device intended to frequency-transpose a microwave signal of frequency f1 into a microwave signal of frequency f2. The application of the invention lies, more particularly, in the production of equipment for directional millimetre radio.

BACKGROUND OF RELATED ART

Radio links are organized around terminal stations and relay stations. Since radio beams are two-directional, each of these stations has a reception system and a transmission system. A terminal station 1 is represented in FIG. 1. This station is connected to an antenna 2 via a waveguide 3. As indicated above, it has a transmission system 4 and a reception system 5. The working frequencies of these systems are respectively the frequencies f1 and f2, of the order of thirty gigahertz. In order for the antenna 2 to be used simultaneously for transmission and reception, the station furthermore has a duplexer 6. Finally, in order to detect any malfunction in one of its elements, the station conventionally comprises a remote loop-back device 7 which, as it.were, is a circuit for monitoring the operation of the station. This device is interposed between the antenna 2 and the duplexer 6. During the station's transmission/reception mode, this device is fully transparent and is not involved in the transmission of the signal of frequency f1 or in the reception of the signal frequency f2. However, when this device is activated, it makes it possible to loop the transmission system of the station back onto its reception system in order to ensure that the terminal station is operating correctly. Of course, when it is active, the terminal stations or the relay stations which are in communication with the terminal station in question are put on standby.

In order to perform this loop-back, the remote loop-back device carries out frequency transposition on the signal of frequency f1 output by the transmission system in order to convert it into a signal of frequency f2 which the reception system of the terminal station can use.

At present, the most commonly used remote loop-back device is produced using a diode and a local oscillator which resonates at the frequency f1-f2 (referred to as the duplex frequency fd). It is represented in FIG. 2. It comprises a diode 8 which is mounted inside the waveguide 3 joining the antenna 2 to the duplexer 6. The anode of the diode is connected to the wall of the waveguide, and its cathode is connected via a wire to the local oscillator. The portion of the wire arranged inside the waveguide makes it possible both to pick up the signal frequency f1 propagating in the waveguide 3, convey the signal of frequency f1-f2 to the diode which carries out the mixing, and transmit the signal of frequency f2 resulting from the mixing of the signals of frequency f1 and fd in the diode. Since the diode 8 is a non-linear component, it actually mixes the signal of frequency f1 with the signal of frequency f1-f2 output by the local oscillator, and consequently produces a signal of frequency f2 which the reception system of the station will be able to use. Furthermore, in order to be fully effective, the diode 8 is positioned in the middle of one side of the waveguide and its axis is parallel to the axis of the electric field E of the electromagnetic waves propagating in the waveguide.

Although very widely used, this device nevertheless has certain drawbacks. First, the presence of the diode inside the waveguide interferes with the propagation of the waves in the waveguide. It constitutes an obstacle to the transport of the wave in the guide, and this results in the appearance of a reflection coefficient at this point in the waveguide. Furthermore, all the parameters relating to the absorption of the frequency f1 by the device as well as those relating to the level of mixing in the diode are dependent on the position of the diode and the wire in the waveguide, and on their dimensions. It is consequently very difficult to set these absorption and mixing level parameters because this is generally done by "twisting" the wire until the desired parameter values are obtained.

SUMMARY OF THE INVENTION

The object of the invention is to overcome these drawbacks by providing a remote loop-back device which allows simpler and faster adjustment.

The invention proposes to place the elements of the remote loop-back device outside the waveguide so as not to interfere with the propagation of the waves travelling in the waveguide. It also proposes to use lossless lines of defined length for transporting the microwave signals outside the waveguide.

The invention therefore relates to a remote loop-back device intended to frequency-transpose a microwave signal of frequency f1 propagating in a waveguide into a microwave signal of frequency f2, the transposition being carried out using a diode and a local oscillator which resonates at the frequency f1-f2, with f1-f2<<f1 or f2, the signals of frequency f1 and f2 both having wavelengths close to a value $\lambda$, characterized in that the device is mounted outside the waveguide, and in that it includes:
  a first line of length $\lambda/2$, a first end of which is slightly inserted into the waveguide and serves as an antenna for receiving the signal of frequency f1 as well as for transmitting the signal of frequency f2, and a second end of which is connected to a first electrode of the diode,
  a second line of length $\lambda/2$, the first end of which is connected to the first electrode of the said diode and the second end of which is unconnected in order to return a very high impedance to the first end of the first line;
  a third line whose length is close to $\lambda/4$ but without being equal to this value, the first end of the said third line being connected to a second electrode of the said diode and its second end being unconnected,
  the fourth line of length $\lambda/4$, the first end of which is connected to the second electrode of the said diode and the second end of which is connected, on the one hand, to a stub and, on the other hand, to the output of the local oscillator, the stub being intended to return a zero impedance for the signals of wavelength $\lambda$ on the second end of the fourth line, and
  a fifth line of length $\lambda/4$, the first end of which is connected to the first electrode of the said diode and the second end of which is earthed.

Advantageously, the remote loop-back device furthermore includes a first series of line extension elements beyond the unconnected end of the second line, which can be connected thereto by welding in order to adjust its length and thus to adjust the impedance returned to the unconnected end of the first line. The absorption level of the device is adjusted in this way.

The remote loop-back device furthermore includes a second series of line extension elements beyond the unconnected end of the third line, which can be connected thereto by welding in order to adjust its length and consequently to adjust the mixing level of the signals in the diode.

BRIEF DESCRIPTION OF THE DRAWINGS

Other characteristics and advantages of the invention will become apparent on reading the following detailed description, which is given with reference to the appended drawings in which, further to FIGS. 1 and 2 which have already been described.

DETAILED DESCRIPTION

Figure 1:
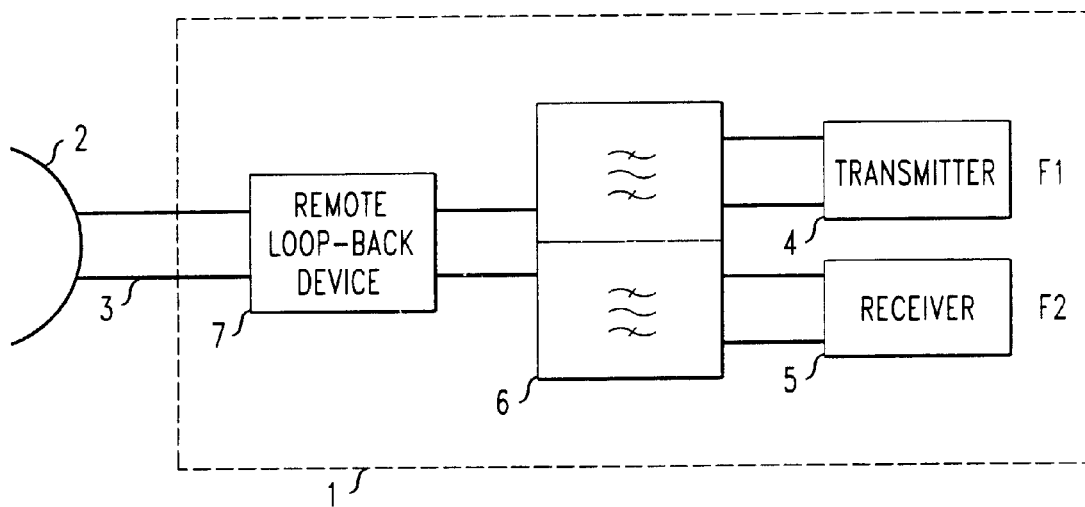
Figure 2:
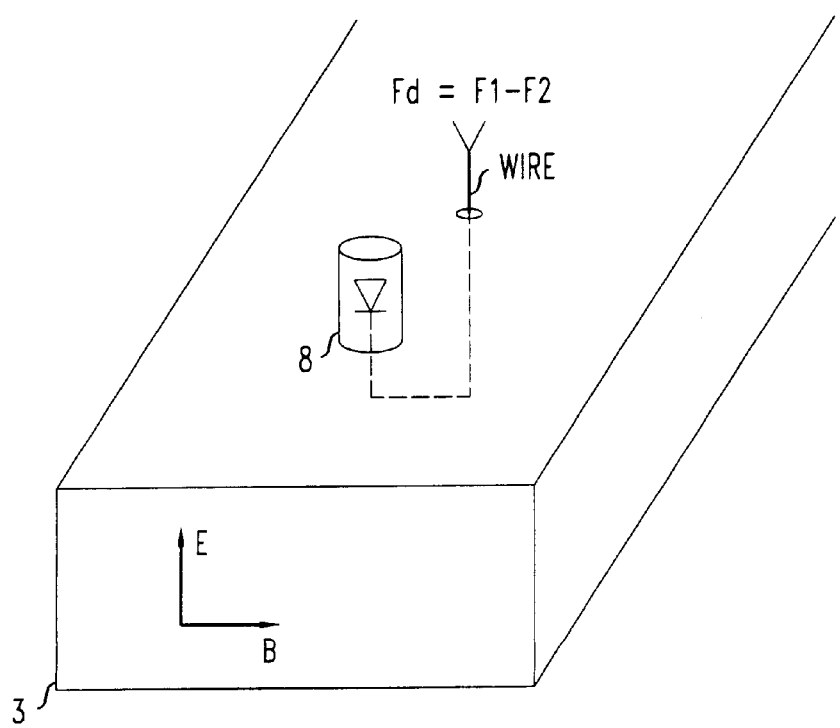

In transmission equipment as represented in FIG. 1, the transmission and reception frequencies f1 and f2 are very similar; the corresponding signals therefore have wavelengths close to a value λ.

In order to process the microwave signal frequency f1 outside the waveguide, use will be made of lossless lines of defined length of the "microstrip" type. Since, with microwaves, the line dimension is not negligible compared with the wavelength of the signals used, the current and voltage consequently vary along these lines. The same is true for the impedance, namely the ratio of the voltage to the current. It is therefore necessary to take the length of these lines into account in order to transmit the microwave signals appropriately.

Figure 3:
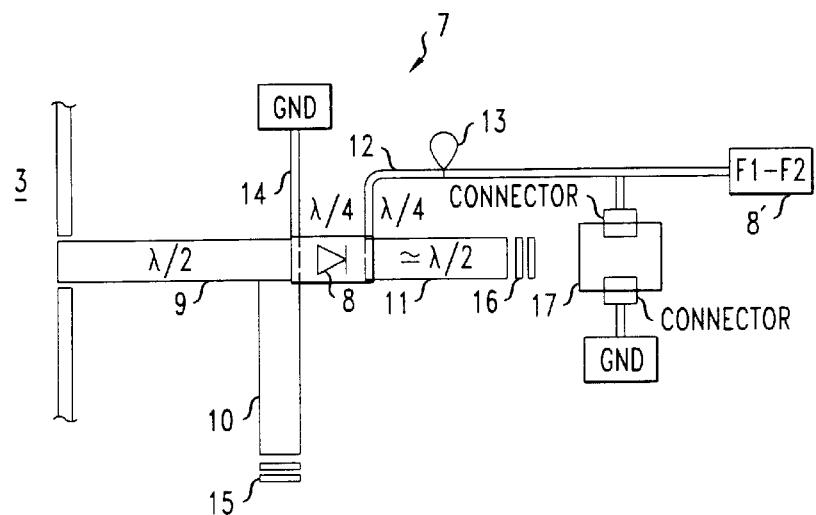
FIG. 3 represents one embodiment of the remote loop-back device according to the invention.

Referring to FIG. 3, the remote loop-back device 7 firstly has a first lossless line 9 of λ/2, intended to convey the signal of frequency f1 to the microwave diode 8. This line is connected by one of its ends to a first electrode of the diode 8. The purpose of this diode is to mix the signal of frequency f1 with the signal of frequency f1-f2. The line 9 is slightly inserted into the waveguide 3 in order to pick up the signal of frequency f1.

The line 9 also makes it possible for the signal of frequency f2 generated in the microwave diode to be returned into the waveguide 3. In order for the line 9 not to interfere with the propagation of the waves in the guide 3, the device has a second lossless line 10 of length λ/2, intended to return an open-circuit to the unconnected end of the line 9. In order to do this, one of the ends of the line 10 is joined to the connected end of the line 9, and its other end is left unconnected. Advantageously, the device also includes a series of line extension elements 15 beyond the unconnected end of the line 10, which can be connected thereto by welding in order to adjust its length, and thus to adjust the impedance returned to the unconnected end of the line 9. The absorption level of the device 7 can consequently be adjusted using this series of elements.

The remote loop-back device also includes a third lossless line 11, the length of which is close to λ/4 but without being equal to this value. This line is connected by one end to the second electrode of the diode 8, and its other end is left unconnected. This line is intended to return a very small impedance on the second electrode of the diode, so that the signal of frequency f1 passes through the latter. The length of this line is preferably slightly less than λ/4, so that the level of the microwave signal on the second electrode is non-zero, and the diode can mix the signal of frequency f1 with the signal of frequency f1-f2 which arrives on this same electrode.

A series of line extension elements 16 is arranged beyond the unconnected end of the line 11; these elements can be connected to the line 11 by welding in order to adjust its length and thus to adjust the mixing level in the diode 8.

The remote loop-device 7 furthermore includes a fourth lossless line 12 of length λ/4, connected via a first end to the second electrode of the diode 8, by a second end to a stub 13 and to the local oscillator 8'. The stub 13 is intended to return a short-circuit on the second end of the line 12. In the diagram in FIG. 3, the stub 13 is a "butterfly". It would also have been possible to use a quarter-wave line instead of the stub. The line 12 makes it possible both to convey the signal of frequency f1-f2 output by the local oscillator and to isolate the local oscillator in terms of microwaves.

Finally, the remote loop-back device 7 comprises a lossless line 14 of length λ/4 which is connected, on the one hand, to the first electrode of the diode 8 and, on the other hand, is earthed. This line is intended to close the path of the microwave signal f1-f2.

In the example in FIG. 3, the local oscillator 8' is provided with a protective resistor 17 mounted in parallel on its output in order to protect the microwave diode 8 against possible electrostatic discharges.

In a particular embodiment, the local oscillator 8' may be produced using a quartz crystal which delivers a signal of frequency f1-f2/10, followed by a full-wave rectifier, with the mixing diode 8 multiplying the frequency of the signal output by the rectifier by 5 as well as mixing it with the signal of frequency f1.

Figure 4:
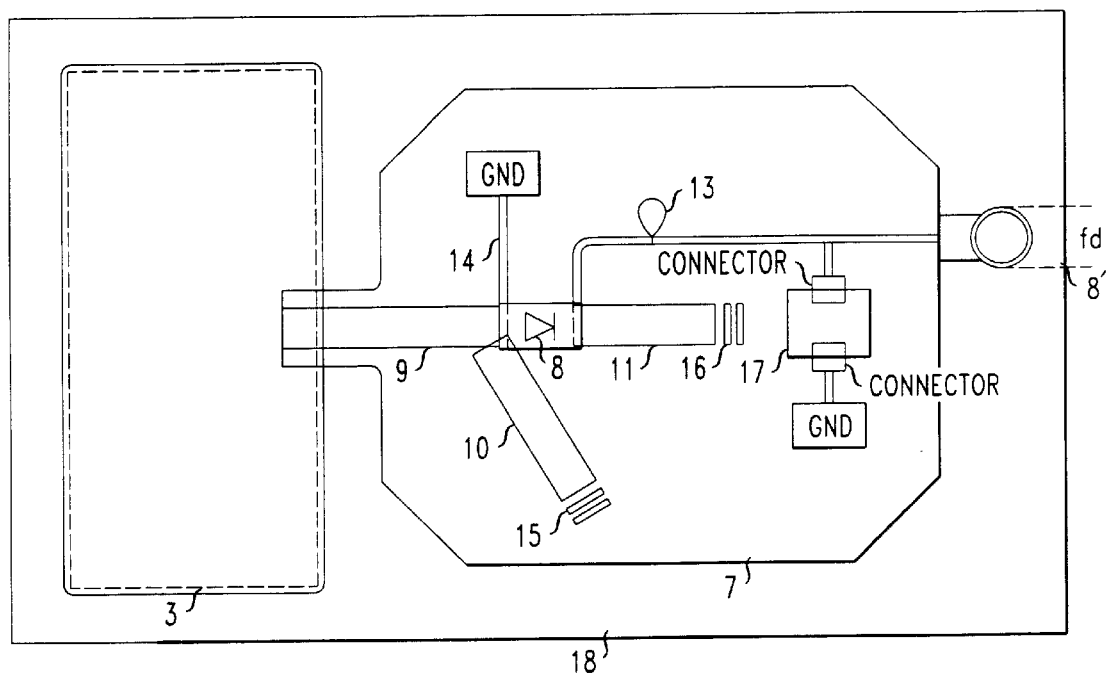
FIG. 4 represents a front view of a support intended for fitting the remote loop-back device of the invention onto a waveguide.

FIG. 4 represents a front view of a support intended to fit the remote loop-back device of the invention onto a waveguide. This support is a rectangular plate, preferably made of PTFE, in which two openings have been made, one for accommodating the remote loop-back device 7 and the other for accommodating the waveguide 3. In order to slightly engage the line 9 of the device in the waveguide, the latter has an orifice intended for this purpose on one of its side walls.

Even though just one embodiment was described in FIG. 3, it is clear that any modification made by the person skilled in the art in the same spirit would not depart from the scope of the invention.

What is claimed is:

1. Remote loop-back device intended to frequency-transpose a microwave signal of frequency f1 propagating in a waveguide (3) into a microwave signal of frequency f2, the transposition being carried out using a diode (8) and a local oscillator (8') which resonates at the frequency f1-f2, with f1-f2<<f1 or f2, the signals of frequency f1 and f2 both having wavelengths close to a value λ, characterized in that the device is mounted outside the waveguide (3), and in that it includes:

a first line (9) of length λ/2, a first end of which is slightly inserted into the waveguide (3) and serves as an antenna for receiving the signal of frequency f1 as well as for transmitting the signal of frequency f2, and a second end of which is connected to a first electrode of the diode (8), a second line (10) of length λ/2, the first end of which is connected to the first electrode of the said diode (8) and the second end of which is unconnected in order to return a very high impedance to the first end of the first line (9);

a third line (11) whose length is close to λ/4 but without being equal to this value, the first end of the said third line (11) being connected to a second electrode of the said diode (8) and its second end being unconnected, the fourth line (12) of length λ/4, the first end of which is connected to the second electrode of the said diode (8) and the second end of which is connected, on the one hand, to a stub (13) and, on the other hand, to the output of the local oscillator (8') the stub (13) being intended to return a zero impedance for the signals of wavelength $\lambda$ on the second end of the fourth line (12), and a fifth line (14) of length $\lambda/4$, the first end of which is connected to the first electrode of the said diode (8) and the second end of which is earthed.

2. Remote loop-back device according to claim 1, characterized in that it furthermore includes a first series of line extension elements (15) beyond the unconnected end of the second line (10), which can be connected thereto by welding in order to adjust its length.

3. Remote loop-back device according to claim 1 or 2, characterized in that it furthermore includes a second series of line extension elements (16) beyond the unconnected end of the third line (11), which can be connected thereto by welding in order to adjust its length.

* * * * *